(12) United States Patent
Gloria et al.

(10) Patent No.: US 6,876,076 B2
(45) Date of Patent: Apr. 5, 2005

(54) MULTILAYER SEMICONDUCTOR DEVICE FOR TRANSMITTING MICROWAVE SIGNALS AND ASSOCIATED METHODS

(75) Inventors: Daniel Gloria, Grenoble (FR); André Perrotin, Seyssinet (FR)

(73) Assignee: STMicroelectronics SA, Montrouge (FR)

(*) Notice: Subject to any disclaimer, the term of this patent is extended or adjusted under 35 U.S.C. 154(b) by 0 days.

(21) Appl. No.: 10/184,027

(22) Filed: Jun. 27, 2002

(65) Prior Publication Data

US 2003/0001279 A1 Jan. 2, 2003

(30) Foreign Application Priority Data

Jun. 28, 2001 (FR) .............................. 01 08558

(51) Int. Cl.⁷ .............................................. H01L 23/34
(52) U.S. Cl. ...................... 257/728; 257/275; 257/276; 257/277; 257/662; 257/664; 257/758
(58) Field of Search ................................. 257/275–277, 257/661–664, 728, 758–760, 259, 625, 659

(56) References Cited

U.S. PATENT DOCUMENTS

| | | | |
|---|---|---|---|
| 4,673,904 A | | 6/1987 | Landis ........................ 333/238 |
| 4,875,087 A | * | 10/1989 | Miyauchi et al. ............. 357/71 |
| 5,049,978 A | * | 9/1991 | Bates et al. .................. 257/686 |
| 5,338,897 A | | 8/1994 | Tsay et al. ................. 174/35 R |
| 5,387,888 A | * | 2/1995 | Eda et al. ..................... 333/247 |
| 5,528,074 A | * | 6/1996 | Goto et al. .................. 257/664 |
| 5,563,522 A | * | 10/1996 | Abe ............................. 324/758 |
| 5,565,706 A | * | 10/1996 | Miura et al. ................. 257/723 |
| 5,567,982 A | * | 10/1996 | Bartelink ...................... 257/664 |
| 5,952,709 A | * | 9/1999 | Kitazawa et al. ............ 257/664 |
| 5,977,631 A | * | 11/1999 | Notani ......................... 257/728 |
| 6,016,000 A | * | 1/2000 | Moslehi ....................... 257/522 |
| 6,057,600 A | * | 5/2000 | Kitazawa et al. ............ 257/728 |
| 6,075,423 A | * | 6/2000 | Saunders ....................... 333/33 |
| 6,133,621 A | | 10/2000 | Gaibotti et al. ............. 257/659 |
| 6,335,494 B1 | * | 1/2002 | Gregor et al. ............... 174/261 |
| 6,356,173 B1 | * | 3/2002 | Nagata et al. ............... 333/247 |
| 6,433,408 B1 | * | 8/2002 | Anjo et al. ................... 257/664 |
| 2001/0054748 A1 | * | 12/2001 | Wikborg et al. ............. 257/595 |
| 2002/0084514 A1 | * | 7/2002 | Maetani ....................... 257/662 |
| 2003/0020173 A1 | * | 1/2003 | Hukk et al. .................. 257/774 |

FOREIGN PATENT DOCUMENTS

| | | | |
|---|---|---|---|
| EP | 0911903 | 4/1999 | ............ H01P/3/06 |
| GB | 2286286 | 8/1995 | ........... H01L/23/52 |
| WO | 97/35344 | 9/1997 | ........... H01L/23/60 |

* cited by examiner

*Primary Examiner*—Mary Wilczewski
*Assistant Examiner*—Monica Lewis
(74) *Attorney, Agent, or Firm*—Lisa K. Jorgenson; Allen, Dyer, Doppelt, Milbrath & Gilchrist, P.A.

(57) ABSTRACT

A multilayer semiconductor device includes at least one structure for transmitting electrical signals, and in particular, microwave signals. The device includes at least one electrically conductive enclosure that includes a bottom plate and a top plate in two different layers. Lateral walls connect the bottom and top plates. Electrically conductive connecting strips extend into the enclosure and are in an intermediate layer, and are electrically insulated from the enclosure. The enclosure has at least one passage through which extends electrical connections of the connecting strips, which are also electrically insulated from the enclosure.

24 Claims, 8 Drawing Sheets

MULTILAYER SEMICONDUCTOR DEVICE FOR TRANSMITTING MICROWAVE SIGNALS AND ASSOCIATED METHODS

FIELD OF THE INVENTION

The present invention relates to integrated circuits, and more particularly, to a transmission circuit for transmitting microwave signals or the like.

BACKGROUND OF THE INVENTION

In recent years, with the development of equipment that exploit microwave signals, there has been a rapid increase in the number of transmission circuits equipped with transmission strips. These circuits typically include an enclosure that covers the transmission strip, which is connected to a high-frequency semiconductor structure.

In particular, the size of the enclosure affects the overall size of the circuit that includes the high-frequency semiconductor structure. Many times these enclosures allow the transmission strip and the high-frequency semiconductor structure to be subjected to interference and noise.

SUMMARY OF THE INVENTION

An object of the present invention is to provide a compact structure enabling internal transmission of electrical signals, and in particular, microwave signals, such that the signals are subjected to less interference or noise. In one application, an object of the present invention is to provide a structure for testing integrated circuit parameters, such as transition frequencies, oscillation frequencies and noise factors using microwave measurements.

The multilayer semiconductor device according to the present invention includes at least one structure for transmitting electrical signals, such as microwave signals. This structure includes at least one electrically conductive material cage or enclosure which includes a bottom plate and a top plate situated in two different layers, and lateral walls that connect the plates. At least one electrically conductive material connecting strip extends into the enclosure, and is in an intermediate layer, and is electrically insulated from the enclosure. The enclosure has at least one passage through which extends electrical connecting means of the transmission strip. The electrical connecting means are electrically insulated from the cage.

The walls of the cage preferably include strips formed in intermediate layers, and the plates and the strips are respectively connected by connecting vias. According to one variation of the invention, the transmission strip has at least two parts respectively connected to two parts of at least one integrated electronic component.

According to the present invention the enclosure can advantageously include at least one opening for the electrical connecting means of the integrated electronic component to pass through. The component is preferably outside the enclosure. The top plate can advantageously have at least three parts, two of which are electrically insulated and connected to the transmission strip. The bottom plate can advantageously have at least one passage through it through which extend means for electrically connecting the transmission strip to an integrated electronic component under the bottom plate.

According to one application, the device may be implanted in an integrated circuit. According to another application, the device may be implanted at a location of an integrated circuit wafer forming a cut-out area between the integrated circuits.

BRIEF DESCRIPTION OF THE DRAWINGS

The present invention will be better understood after studying semiconductor devices including electrical connection structures described by way of non-limiting examples, and as shown in the drawings, in which.

DETAILED DESCRIPTION OF THE PREFERRED EMBODIMENTS

FIGS. 1 to 11 show a semiconductor device 1 which includes on a base integrated component wafer 2 a structure 3 for transmitting electrical signals, and in particular, microwave signals, formed on a plurality of electrically conductive material layers. These electrically conductive material layers will be generally referred to as metal layers.

In the example, the structure 3 includes five successive metal layers M1, M2, M3, M4 and M5. The first metal layer M1 is in contact with the base wafer 2. These layers are usually spaced by dielectric layers. The structure 3 includes an enclosure 4 whose walls are constructed in the following manner. As shown in FIGS. 1, 2, 3 and 8 to 11 in particular, the enclosure 4 includes a rectangular bottom plate 5 that is formed longitudinally in the first metal layer M1.

As shown in FIGS. 1, 2, 7 and 8 to 11 in particular, the enclosure 4 includes a top plate 6 which is formed longitudinally in the fifth metal layer M5. The top plate 6 includes a rectangular central part 7 and two rectangular end parts 8 and 9 remote from the central part 7, and covers the bottom plate 5.

As shown in FIGS. 1, 2, 4 to 6 and 11 in particular, between the end parts 8 and 9 of the top plate 6, the structure 4 respectively includes rectangular transverse plates 10, 11 and 12 and rectangular transverse plates 13, 14 and 15 respectively formed in the intermediate metal layers M2, M3 and M4. The bottom plate 5, the intermediate plates 10, 11 and 12 and the end part 8 of the top plate 6 are respectively connected by four groups of electrically connecting vias 16, 17, 18 and 19 formed through the dielectric layers. Similarly, the bottom plate 5, the intermediate plates 13, 14 and 15 and the end part 9 of the top plate 6 are respectively connected by groups of electrically connecting vias 20, 21, 22 and 23 formed through the dielectric layers.

As shown in FIGS. 1, 2, 4 to 6, and 8 to 9 in particular, between the longitudinal edges of the bottom plate 5 and the longitudinal edges of the central part 7 of the top plate 9, the cage 4 includes intermediate longitudinal strips 24, 25 and 26, and intermediate longitudinal strips 27, 28 and 29. These strips are formed in the intermediate metal layers M2, M3 and M4.

The bottom plate 5, the intermediate strips 24, 25 and 26 and the top part 7 of the plate 6 are respectively connected by four groups of electrically connecting vias 31, 32, 33 and 34 formed through the dielectric layers. Similarly, the bottom plate 5, the intermediate strips 27, 28 and 29 and the central part 7 of the top plate 6 are respectively connected by four groups of electrically connecting vias 31a, 32a, 33a and 34a formed through the dielectric layers.

Figure 1:
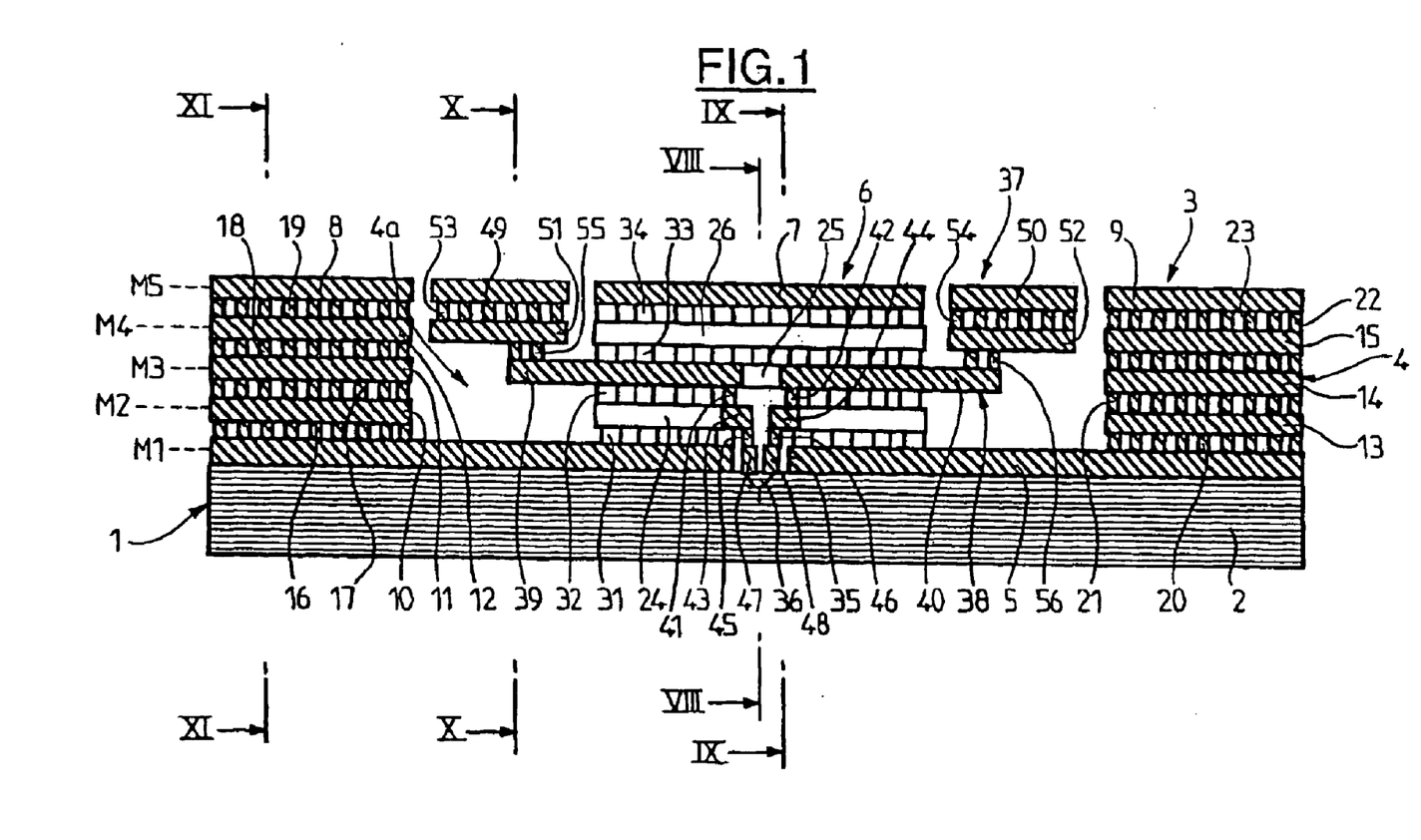
FIG. 1 is a median longitudinal sectional view of a structure in accordance with the present invention.
Figure 2:
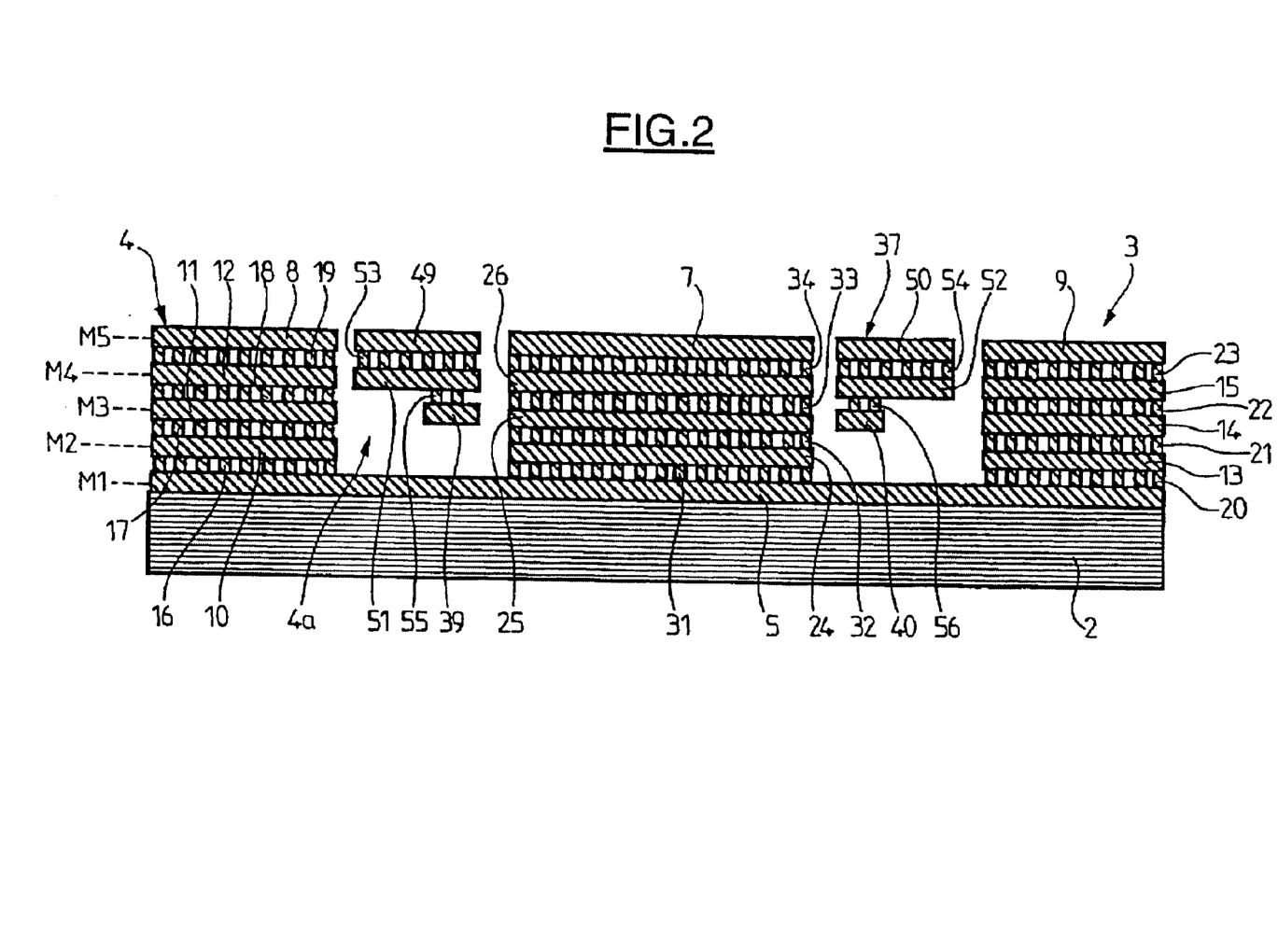
FIG. 2 is a longitudinal sectional view close to a longitudinal edge of the structure illustrated in FIG. 1.
Figure 3:
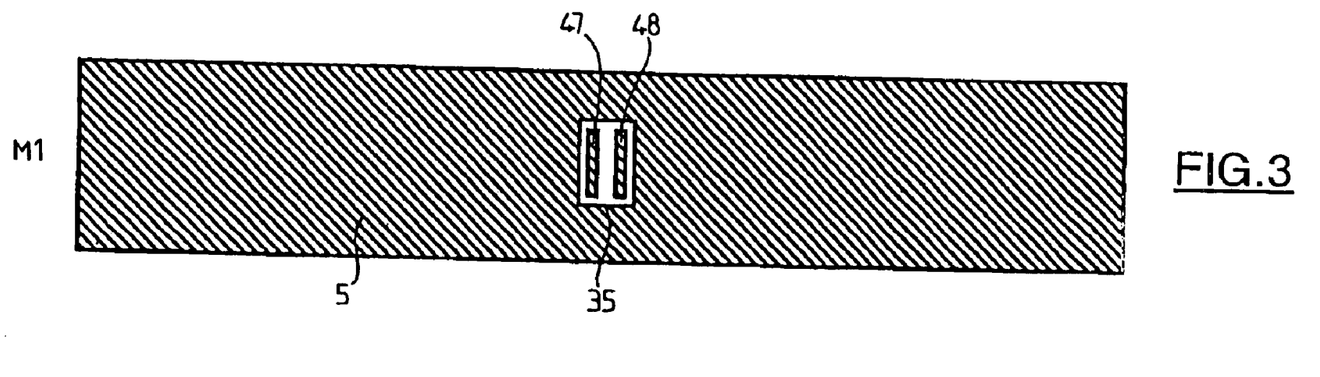
FIG. 3 is a sectional plan view of the first metal layer M1 of the structure illustrated in FIG. 1.
Figure 4:
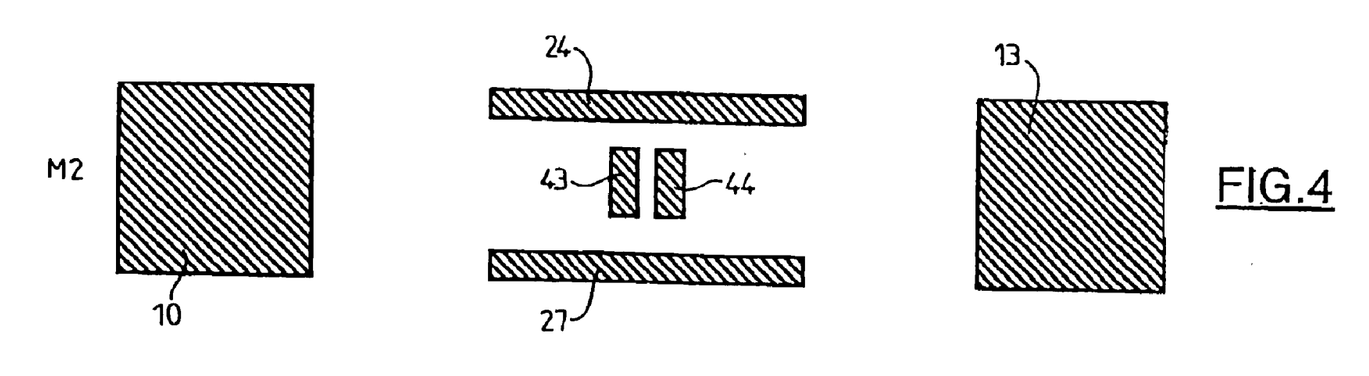
FIG. 4 is a sectional plan view of the second metal layer M2 of the structure illustrated in FIG. 1.
Figure 5:
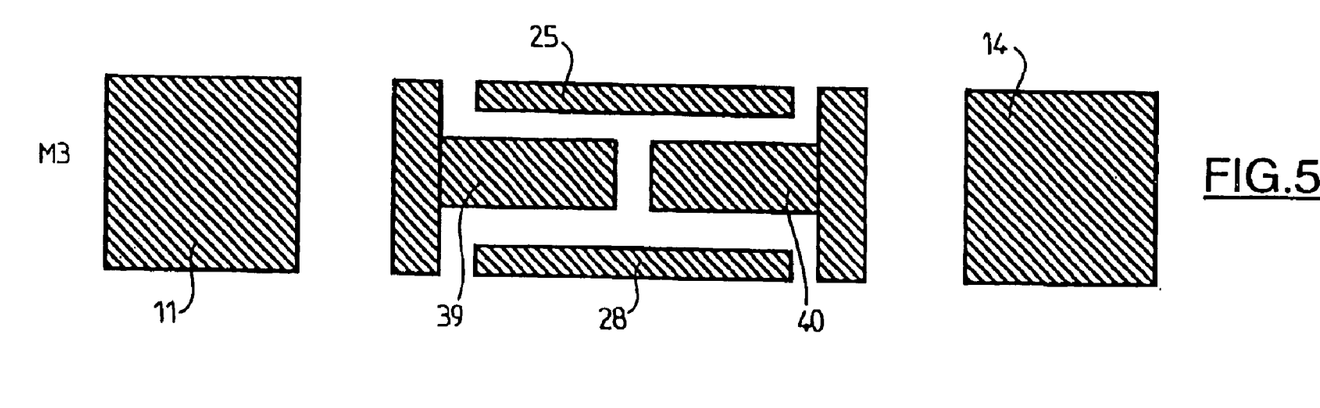
FIG. 5 is a sectional plan view of the third metal layer M3 of the structure illustrated in FIG. 1.
Figure 6:
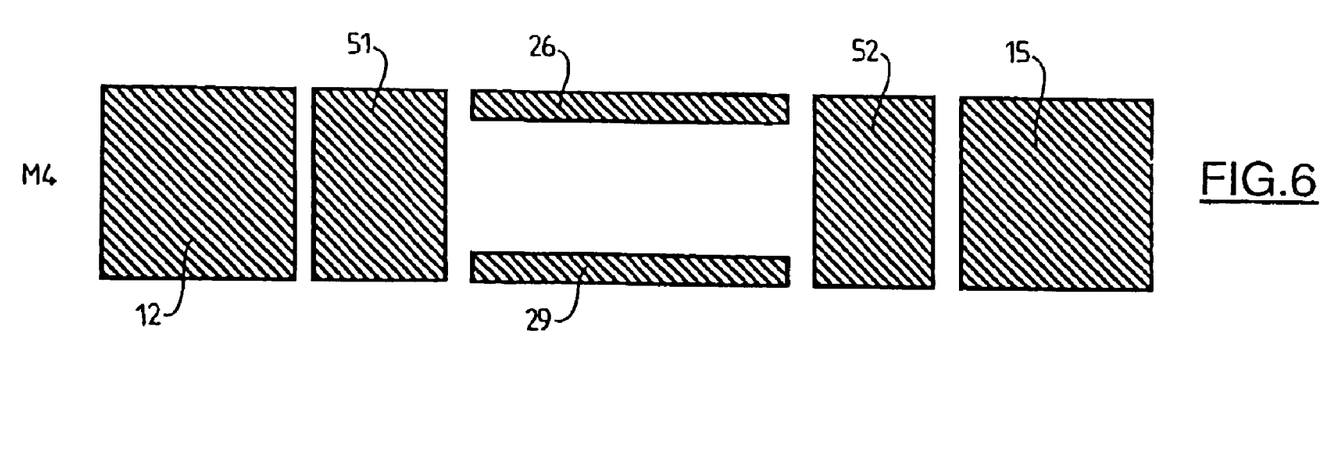
FIG. 6 is a sectional plan view of the fourth metal layer M4 of the structure illustrated in FIG. 1.
Figure 7:
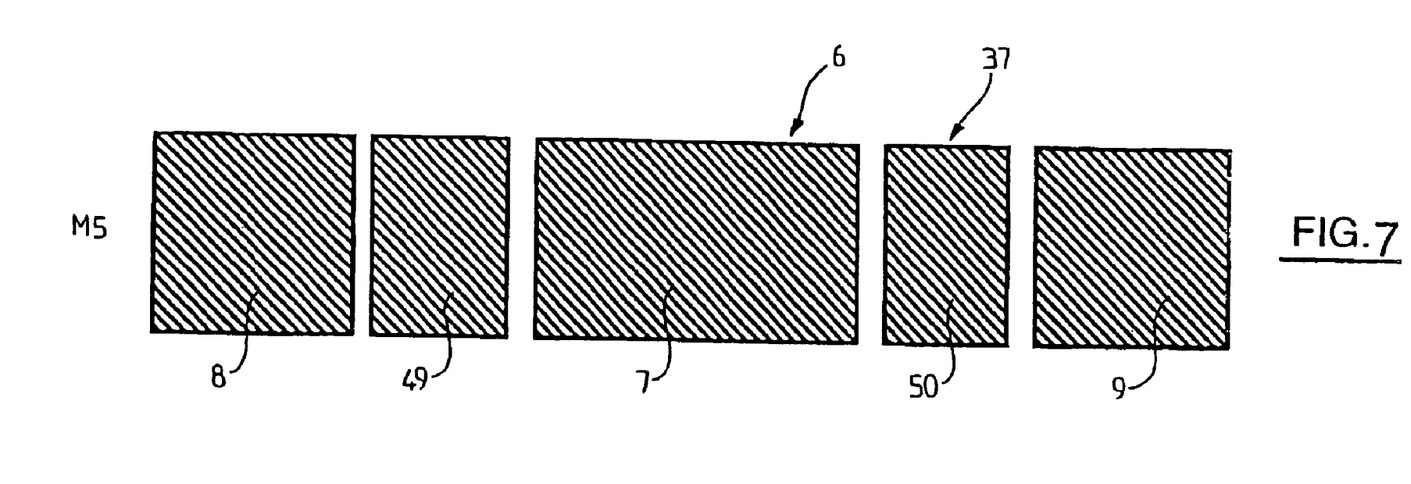
FIG. 7 is a sectional plan view of the fifth metal layer M5 of the structure illustrated in FIG. 1.
Figure 8:
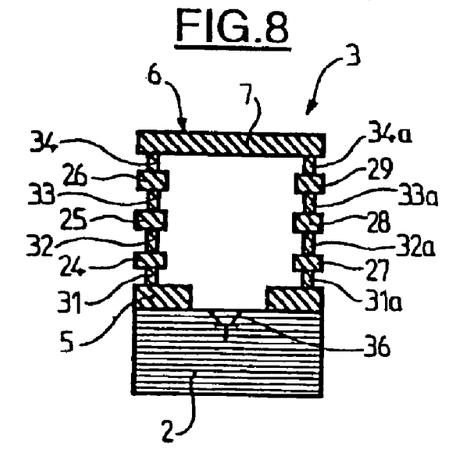
FIG. 8 is a cross-sectional view of the structure illustrated in FIG. 1 taken along line VIII—VIII.
Figure 9:
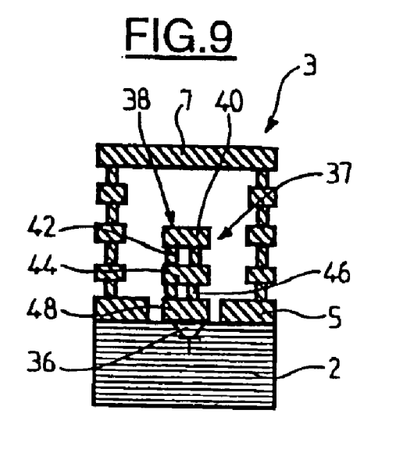
FIG. 9 is a cross-sectional view of the structure illustrated in FIG. 1 taken along line IX—IX.
Figure 10:
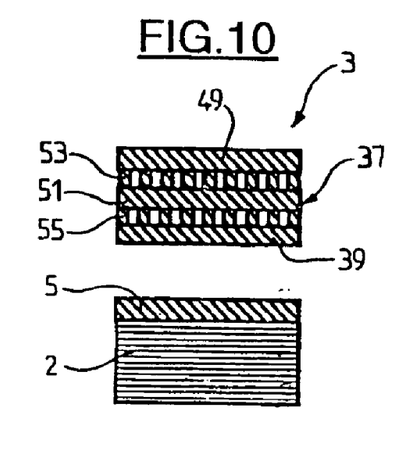
FIG. 10 is a cross-sectional view of the structure illustrated in FIG. 1 taken along line X—X.
Figure 11:
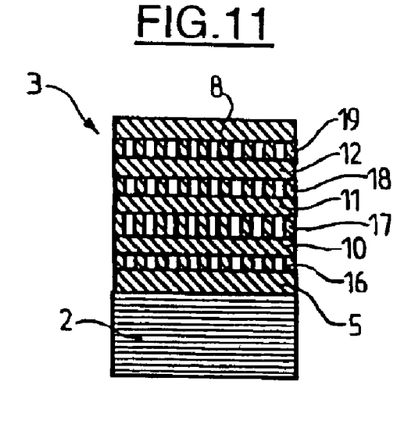
FIG. 11 is a cross-sectional view of the structure illustrated in FIG. 1 taken along line XI—XI near the lateral edge.

As shown in FIGS. 1, 3 and 8 in particular, the bottom plate 5 has a passage 35 through its center below which the base wafer 2 includes an integrated electronic component 36, such as a transistor. The enclosure 4 therefore delimits an open space 4a between the central part 7 and the end parts 8 and 9 of its top plate 6.

As shown in FIGS. 1, 4, 5, 6, 7, and 9 to 10 in particular, the structure 3 further includes electrical connection means 37 which are electrically insulated from the enclosure 4 and include a longitudinal electrical connection strip 38 which extends into the enclosure 4 and is formed in the third metal layer M3.

The connecting strip 38 has two longitudinal parts 39 and 40 whose adjoining ends are respectively connected, for example, to the base and to the collector of the transistor 36 by vias 41 and 42, terminals 43 and 44 formed in the second metal layer M2, connecting vias 45 and 46, and terminals 47 and 48 formed in the first metal layer M1 through the passage 35 in the bottom plate 5.

In the passages between the central part 7 and the end parts 8 and 9 of the top plate 6, the connecting means 37 include transverse strips 49 and 50 formed in the fifth metal layer M5 and transverse strips 51 and 52 formed in the fourth metal layer M4. The transverse strips 49 and 50 are connected by a group of connecting vias 53, and the transverse strips 50 and 52 are connected by a group of connecting vias 54, respectively formed through the dielectric layers.

Furthermore, the end top face of the part 39 of the longitudinal strip 38 is connected to the bottom face of the transverse plate 51 by a group of vias 55, and the end top face of the part 40 of the longitudinal strip 38 is connected to the bottom face of the plate 52 by a group of connecting vias 56. The connecting means 37 are therefore integrated into the enclosure 4, and are electrically insulated from it so that the following connections can be obtained.

The top face of the central part 7 of the top plate 6 forms an electrical contact area connected to the emitter of the transistor 36 through the sides of the enclosure 4 and the bottom plate 5. The top faces of the transverse strips 49 and 50 of the connecting means 37 form electrical contact areas connected to the base and the collector of the transistor 36 through two parts of the connecting means 37 respectively including the parts 39 and 40 of the interior connecting strip 38.

Figure 12:
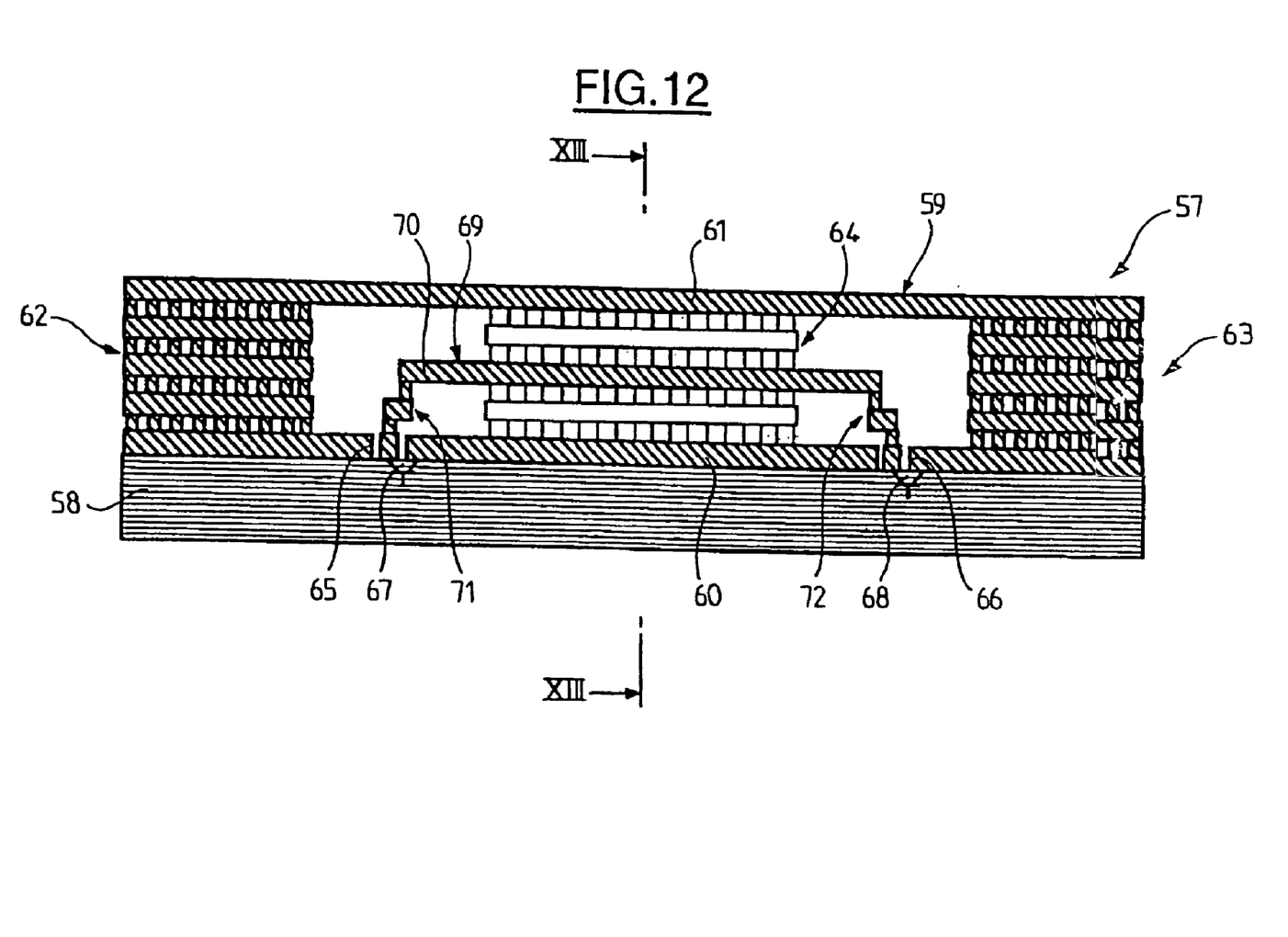
FIG. 12 is a longitudinal sectional view of another structure in accordance with the present invention.
Figure 13:
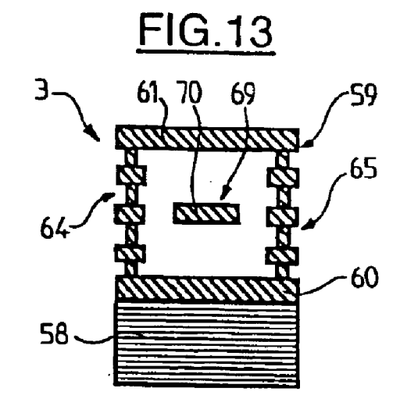
FIG. 13 is a cross-sectional view of the structure illustrated in FIG. 12 taken along line XIII—XIII.

FIGS. 12 and 13 show a structure 57 formed on a base wafer 58, which is a variation of the previous example. The structure 57 includes an enclosure 59 comprising a bottom longitudinal plate 60, a continuous top plate 61, and between the end parts of the plates, stacks 62 and 63 of transverse plates and groups of connecting vias. These connecting vias are formed in the same way as those between the bottom plate 5 and the parts 8 and 9 of the top plate 6 of the previous example, as well as longitudinal stack 64 corresponding to the stacks of longitudinal strips and connecting vias between the bottom plate 5 and the central part 7 of the top plate 6 of the previous example. The bottom plate 60 has two passages 65 and 66 through it below which the base wafer 58 includes transistors 67 and 68.

The structure 57 further includes electrical connection means 69 which include a longitudinal connecting strip 70 extending into the enclosure 69 which, in this variation, is continuous, as well as stacks 71 and 72. The stacks 71 and 72 include terminals and vias disposed between the end parts of the longitudinal strip 70 and a connecting part of the transistors 67 and 68. The stacks 71 and 72 are formed in the same manner as those connecting the parts 39 and 40 of the longitudinal strip 38 to the transistor 36 in the preceding example. Thus, the transistors 67 and 68 are connected through the interior space of the cage 58 by the longitudinal strip 70 and the connecting stacks 71, and 72 through the passages 65 and 66 in the bottom plate 60.

Figure 14:
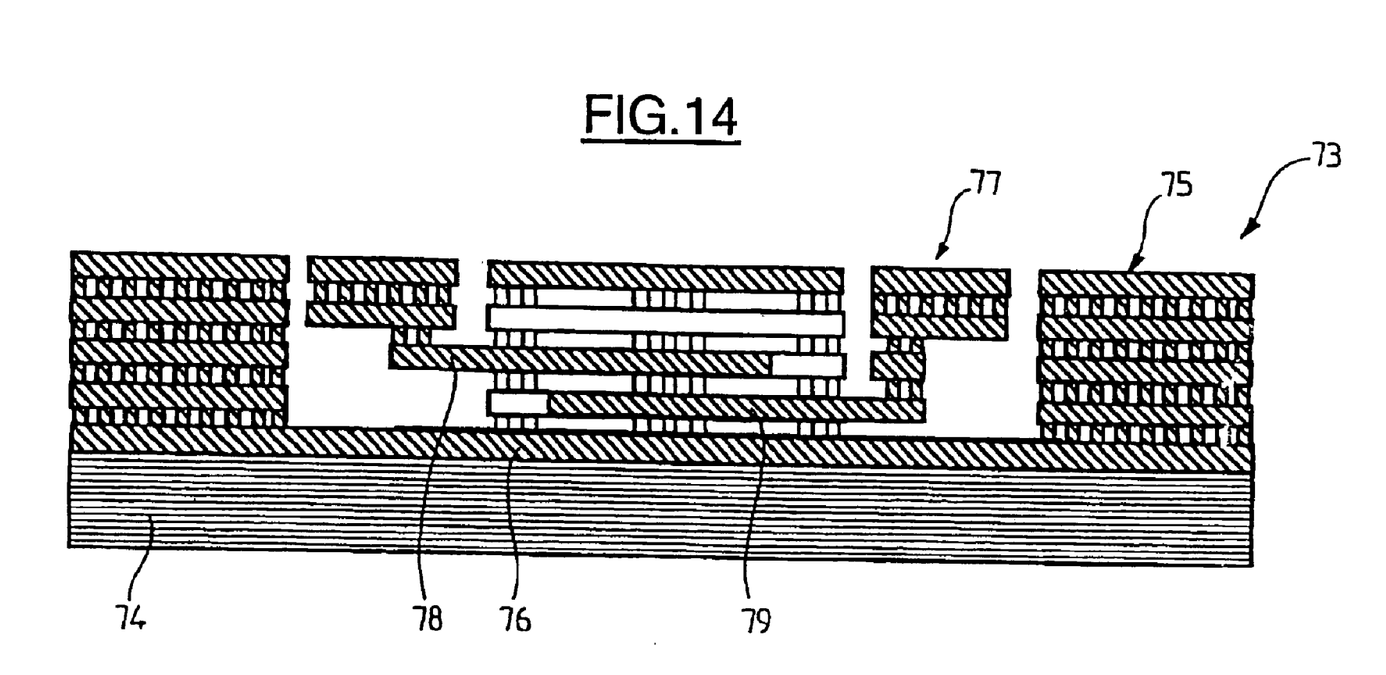
FIG. 14 is a longitudinal sectional view of another structure in accordance with the present invention.

FIG. 14 shows a structure 73 formed on a base wafer 74 which includes a cage 75 which differs from that described with reference to FIGS. 1 to 11 only in that its bottom plate 76 is solid. The base wafer 74 does not include a component on the bottom.

The structure 73 also includes electrical connecting means 77 that differ from those described with reference to FIGS. 1 to 11 only in that they include, in the cage 75, two longitudinal connecting strips 78 and 79 formed in two different intermediate metal layers M2 and M3 so as to have parts overlapping at a distance. The longitudinal strips 78 and 79 could advantageously be used to connect metal capacitors formed between them, for example.

The structures that have just been described can be implanted in integrated circuits formed on base wafers so as to benefit from the advantages of electromagnetic shielding. The structures may also be implanted in locations of integrated circuit wafers forming a cutout area between the latter. In this case, the structures can be used for carrying out microwave tests on the circuits, with the benefit of the same advantages.

That which is claimed is:

1. A semiconductor device comprising:
    a semiconductor substrate;
    at least one transmitter structure monolithically integrated in said semiconductor substrate for transmitting a signal; and
    at least one enclosure on said semiconductor substrate and comprising a plurality of electrically conductive layers, said plurality of electrically conductive layers comprising
        a bottom layer forming a bottom plate,
        a top layer forming a top plate, and
        at least one intermediate layer defining side walls connecting the top and bottom plates, and defining at least one transmission strip above said at least one transmitter structure and extending within said at least one enclosure and being electrically insulated therefrom;

said at least one enclosure having at least one passage therein and extending through the bottom plate to expose said at least one transmitter structure, and comprising at least one electrical connector connected to said at least one transmission strip and extending through the at least one passage, said at least one electrical connector being electrically insulated from said at least one enclosure.

2. A semiconductor device according to claim 1, wherein the transmitted signal is a microwave signal.

3. A semiconductor device according to claim 1, wherein said at least one transmitter structure comprises at least one transistor.

4. A semiconductor device according to claim 1, wherein said at least one intermediate layer comprises a plurality of intermediate layers; and wherein said at least one enclosure further comprises a plurality of vias for connecting the bottom and top plates with said plurality of intermediate layers.

5. A semiconductor device according to claim 1, wherein said at least one transmitter structure comprises a first transmitting portion and a second transmitting portion; and wherein said at least one transmission strip comprises at least a first portion and a second portion respectively connected to said first and second transmitting portions.

6. A semiconductor device according to claim 1, wherein said at least one electrical connector is connected between said at least one transmitter structure and said at least one transmission strip.

7. A semiconductor device according to claim 1, wherein said top plate comprises at least a first top portion and a second top portion electrically insulated from said at least one enclosure; and wherein said at least one transmission strip comprises at least a first portion and a second portion respectively connected to said first and second top portions.

8. A semiconductor device according to claim 1, wherein said at least one enclosure is integrated within an integrated circuit along with said semiconductor substrate and said at least one transmitter structure.

9. A semiconductor device according to claim 8, wherein the integrated circuit includes a cutout area separating the integrated circuit into first and second areas; and wherein said semiconductor substrate, said at least one transmitter structure and said at least one enclosure are within the cutout area.

10. A semiconductor device comprising:

a semiconductor substrate;

at least one transmitter structure in said semiconductor substrate for transmitting a signal; and at least one enclosure on said semiconductor substrate and comprising a plurality of electrically conductive layers, said plurality of electrically conductive layers comprising a bottom layer forming a bottom plate, a top layer forming a top plate, and at least one intermediate layer defining side walls connecting the top and bottom plates, and defining at least one transmission strip above said at least one transmitter structure and extending within said at least one enclosure and being electrically insulated therefrom;

said at least one enclosure having at least one passage therein and extending through the bottom plate to expose said at least one transmitter structure, and comprising an electrical connection extending through the at least one passage and connected between said at least one transmission strip and said at least one transmitter structure, said electrical connection being electrically insulated from said at least one enclosure.

11. A semiconductor device according to claim 10, wherein said at least one transmitter structure comprises at least one transistor.

12. A semiconductor device according to claim 10, wherein the transmitted signal is a microwave signal.

13. A semiconductor device according to claim 10, wherein said at least one intermediate layer comprises a plurality of intermediate layers; and wherein said at least one enclosure further comprises a plurality of vias for connecting the bottom and top plates with said plurality of intermediate layers.

14. A semiconductor device according to claim 10, wherein the top plate comprises at least a first top portion and a second top portion electrically insulated from said at least one enclosure; and wherein the at least one transmission strip comprises at least a first portion and a second portion respectively connected to the first and second top portions.

15. A semiconductor device according to claim 10, wherein said semiconductor substrate, said at least one transmitter structure and said at least one enclosure are integrated within an integrated circuit.

16. A semiconductor device according to claim 15, wherein the integrated circuit includes a cutout area separating the integrated circuit into first and second areas; and wherein said semiconductor substrate, said at least one transmitter structure and said at least one enclosure are within the cutout area.

17. A method for making a semiconductor device used for transmitting a signal, the method comprising:

monolithically integrating at least one transmitter structure in a semiconductor substrate; and forming at least one enclosure on the semiconductor substrate, the at least one enclosure comprising a plurality of electrically conductive layers comprising a bottom layer forming a bottom plate, a top layer forming a top plate, and at least one intermediate layer defining side walls connecting the top and bottom plates, and defining at least one transmission strip above the at least one transmitter structure and extending within the at least one enclosure and being electrically insulated therefrom;

the at least one enclosure having at least one passage therein and extending through the bottom plate to expose the at least one transmitter structure, and comprising an electrical connection connected to the at least one transmission strip and extending through the passage, and being electrically insulated from the at least one enclosure.

18. A method according to claim 17, wherein the at least one transmitter structure comprises at least one transistor.

19. A method according to claim 17, wherein the transmitted signal is a microwave signal.

20. A method according to claim 17, wherein the at least one intermediate layer comprises a plurality of intermediate layers; and wherein the at least one enclosure further comprises a plurality of vias for connecting the bottom and top plates with the plurality of intermediate layers.

21. A method according to claim 17, wherein the electrical connection is connected between the at least one transmitter structure and the at least one transmission strip.

22. A method according to claim 17, wherein the top plate comprises at least a first top portion and a second top portion electrically insulated from the at least one enclosure; and wherein the at least one transmission strip comprises at least a first portion and a second portion respectively connected to the first and second top portions.

23. A method according to claim 17, wherein the at least one enclosure is integrated within an integrated circuit along with the semiconductor substrate and the at least one transmitter structure.

24. A method according to claim 23, wherein the integrated circuit includes a cutout area separating the integrated circuit into first and second areas; and wherein the semiconductor substrate, the at least one transmitter structure and the at least one enclosure are within the cutout area.

* * * * *